United States Patent
Lee et al.

(10) Patent No.: US 9,583,462 B2
(45) Date of Patent: Feb. 28, 2017

(54) DAMASCENE RE-DISTRIBUTION LAYER (RDL) IN FAN OUT SPLIT DIE APPLICATION

(71) Applicant: QUALCOMM Incorporated, San Diego, CA (US)

(72) Inventors: Jae Sik Lee, San Diego, CA (US); Hong Bok We, San Diego, CA (US); Dong Wook Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/689,011

(22) Filed: Apr. 16, 2015

(65) Prior Publication Data

US 2016/0218082 A1    Jul. 28, 2016

Related U.S. Application Data

(60) Provisional application No. 62/106,364, filed on Jan. 22, 2015.

(51) Int. Cl.
*H01L 21/02* (2006.01)
*H01L 25/065* (2006.01)
(Continued)

(52) U.S. Cl.
CPC ........ *H01L 25/0655* (2013.01); *H01L 21/565* (2013.01); *H01L 21/7684* (2013.01); *H01L 21/76802* (2013.01); *H01L 21/76843* (2013.01); *H01L 21/76877* (2013.01); *H01L 23/293* (2013.01); *H01L 23/3135* (2013.01); *H01L 23/3171* (2013.01); *H01L 23/5226* (2013.01); *H01L 23/5386* (2013.01); *H01L 23/5389* (2013.01); *H01L 24/19* (2013.01); *H01L 24/20* (2013.01); *H01L 24/96* (2013.01); *H01L 25/50* (2013.01); *H01L 21/568* (2013.01); *H01L 23/49816* (2013.01); *H01L 23/49822* (2013.01); *H01L 23/5383* (2013.01); *H01L 2224/04105* (2013.01); *H01L 2224/12105* (2013.01);
(Continued)

(58) Field of Classification Search
CPC ..... H01L 21/44; H01L 21/311; H01L 21/768; H01L 23/48; H01L 23/538; H01L 23/544; H01L 23/3121; H01L 29/40
USPC ........................................................ 257/621
See application file for complete search history.

(56) References Cited

U.S. PATENT DOCUMENTS 5,969,422 A    10/1999    Ting et al.
6,706,625 B1    3/2004    Sudijono et al.
(Continued)

FOREIGN PATENT DOCUMENTS

EP    0954016 A2    11/1999

OTHER PUBLICATIONS

International Search Report and Written Opinion—PCT/US2015/067863—ISA/EPO—Mar. 17, 2016.

*Primary Examiner* — Michael Lebentritt
(74) *Attorney, Agent, or Firm* — Seyfarth Shaw LLP (57) ABSTRACT

A semiconductor device may include a first semiconductor die. A passivation layer supports the first semiconductor die. The passivation layer may include a first via having a barrier layer and a first redistribution layer (RDL) conductive interconnect coupled to the first via through the barrier layer. The first via may couple the first semiconductor die to the first RDL conductive interconnect.

10 Claims, 10 Drawing Sheets

(51) Int. Cl.
*H01L 21/56* (2006.01)
*H01L 21/768* (2006.01)
*H01L 23/29* (2006.01)
*H01L 23/31* (2006.01)
*H01L 23/522* (2006.01)
*H01L 25/00* (2006.01)
*H01L 23/00* (2006.01)
*H01L 23/498* (2006.01)
*H01L 23/538* (2006.01)

(52) U.S. Cl.
CPC  *H01L 2224/18* (2013.01); *H01L 2224/24137* (2013.01); *H01L 2924/0002* (2013.01)

(56) References Cited

U.S. PATENT DOCUMENTS

| | | | | |
|---|---|---|---|---|
| 7,446,424 B2* | 11/2008 | Lu | ............... | H01L 21/76898 |
| | | | | 257/621 |
| 7,468,545 B2* | 12/2008 | Lin | ............... | H01L 21/2885 |
| | | | | 257/622 |
| 7,767,496 B2* | 8/2010 | Shim | ............... | H01L 21/568 |
| | | | | 257/E21.503 |
| 7,897,503 B2* | 3/2011 | Foster | ............... | B81B 7/0006 |
| | | | | 257/E21.17 |
| 8,017,515 B2* | 9/2011 | Marimuthu | ......... | H01L 23/3121 |
| | | | | 257/737 |
| 8,466,062 B2* | 6/2013 | Lu | ............... | H01L 21/76898 |
| | | | | 257/E21.577 |
| 8,518,796 B2 | 8/2013 | Chen et al. | | |
| 8,810,006 B2* | 8/2014 | Yu | ............... | H01L 25/0652 |
| | | | | 257/620 |
| 9,093,462 B2* | 7/2015 | Ramachandran | ... | H01L 27/0814 |
| 9,177,893 B2* | 11/2015 | Mauder | ............ | H01L 23/481 |
| 9,196,586 B2* | 11/2015 | Chen | ............... | H01L 24/27 |
| 9,299,572 B2* | 3/2016 | Gao | ............... | H01L 23/481 |
| 9,318,404 B2* | 4/2016 | Lin | ............... | H01L 21/561 |
| 9,349,616 B2* | 5/2016 | Lee | ............... | H01L 21/568 |
| 9,369,175 B2* | 6/2016 | Lee | ............... | H01L 24/13 |
| 2006/0158804 A1 | 7/2006 | Usui et al. | | |
| 2011/0198762 A1 | 8/2011 | Scanlan | | |
| 2013/0026632 A1 | 1/2013 | Kikuchi et al. | | |
| 2013/0256910 A1 | 10/2013 | Lee et al. | | |
| 2014/0367867 A1 | 12/2014 | Lin et al. | | |

* cited by examiner

DAMASCENE RE-DISTRIBUTION LAYER (RDL) IN FAN OUT SPLIT DIE APPLICATION

CROSS-REFERENCE TO RELATED APPLICATION

This application claims the benefit under 35 U.S.C. §119(e) to U.S. Provisional Patent Application No. 62/106,364, entitled "DAMASCENE RE-DISTRIBUTION LAYER (RDL) IN FAN OUT SPLIT DIE APPLICATION," filed on Jan. 22, 2015, the disclosure of which is expressly incorporated by reference herein in its entirety.

BACKGROUND

Field

Aspects of the present disclosure relate to semiconductor devices, and more particularly to a redistribution layer for fabrication of a fan out structure.

Background

The process flow for semiconductor fabrication of integrated circuits (ICs) may include front-end-of-line (FEOL), middle-of-line (MOL), and back-end-of-line (BEOL) processes. The front-end-of-line processes may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line processes may include a series of wafer processing steps for interconnecting the semiconductor devices created during the front-end-of-line and middle-of-line processes. Successful fabrication of modern semiconductor chip products involves an interplay between the materials and the processes employed.

An interposer is a die-mounting technology in which the interposer serves as a base upon which the semiconductor dies of a system on chip (SoC) are mounted. An interposer is an example of a fan out wafer level package structure. The interposer may include wiring layers of conductive traces and conductive vias for routing electrical connections between the semiconductor dies (e.g., memory modules and processors) and a system board. The interposer may include a redistribution layer (RDL) that provides a connection pattern of bond pads on the active surface of a semiconductor device (e.g., a die or chip) to a redistributed connection pattern that is more suitable for connection to the system board.

Fabrication of wafer level package structures may include attachment of a semiconductor device (e.g., a die or chip) to the wafer level package structure according to a chip first attach process prior to forming the redistribution layer. The chip first attach process, however, may be problematic for split die applications, rendering the semiconductor device defective because of the formation of the redistribution layer and/or because of defects associated with the redistribution layer.

SUMMARY

A semiconductor device may include a first semiconductor die. A passivation layer supports the first semiconductor die. The passivation layer may include a first via having a barrier layer and a first redistribution layer (RDL) conductive interconnect coupled to the first via through the barrier layer. The first via may couple the first semiconductor die to the first RDL conductive interconnect.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Some described implementations relate to wafer level package structures, such as interposer technology. An interposer generally serves as an intermediate layer that can be used for direct electrical interconnection between one component or substrate and a second component or substrate with the interposer positioned in between. For example, an interposer may have a pad configuration on one side that can be aligned with corresponding pads on a first component (e.g., a die), and a different pad configuration on a second side that corresponds to pads on a second component (e.g., a package substrate, system board, etc.) Interposers are widely used for integrating multiple chips on a single package. In addition, interposer substrates can be composed of glass and quartz, organic, or other like material and normally contain a few interconnect layers.

Fabrication of wafer level package structures, such as interposers, may include the formation of a redistribution layer (RDL). The redistribution layer may enable expansion of a connection pattern of bond pads on the active surface of an active device (e.g., a die or chip) to a redistributed connection pattern that is more suitable for connection to a substrate (e.g., system board, package substrate, printed circuit board, etc.) Conventional fabrication techniques include attaching the active device prior to forming a redistribution layer according to a chip first attach process. The chip first attach process, however, assumes that no defects are associated with the redistribution layer.

Furthermore, conventional fabrication techniques for forming the redistribution layer may result in a step height difference between dies for split die applications. In this arrangement, the molding compound (e.g., silica) between the split die may shrink during the fabrication process (e.g., wafer level molding), resulting in the step height difference. The step height difference leads to malformation of a subsequent conductive interconnect layer coupling the split die (e.g., active dies). In conventional processes, the conductive interconnect layer and the via are concurrently formed within a passivation layer. This passivation layer, however, may be partially absorbed into the step height difference, which affects the proper formation of the subsequent conductive interconnect layer. For example, the absorbed passivation layer may lead to a height difference in the photoresist used to define the conductive interconnect. Unfortunately, such defects and malformed redistribution layers may lead to loss of the active dies.

Various aspects of the disclosure provide techniques for fabrication of a semiconductor device such as a fan out wafer level package, for example, including a redistribution layer that enables a line/space of or up to two (2) microns by two (2) microns. The process flow for semiconductor fabrication may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

In one aspect of the disclosure, the semiconductor device may include a redistribution layer which supports the die. The redistribution layer may include one or more vias (e.g., Vx) coupled to a conductive interconnect layer (e.g., Mx) through a barrier layer. The vias may be arranged to couple the die with the conductive interconnect layer. The vias, which in some aspects, may be fabricated lithographically, may also be formed before depositing the conductive interconnect layer.

Figure 1:
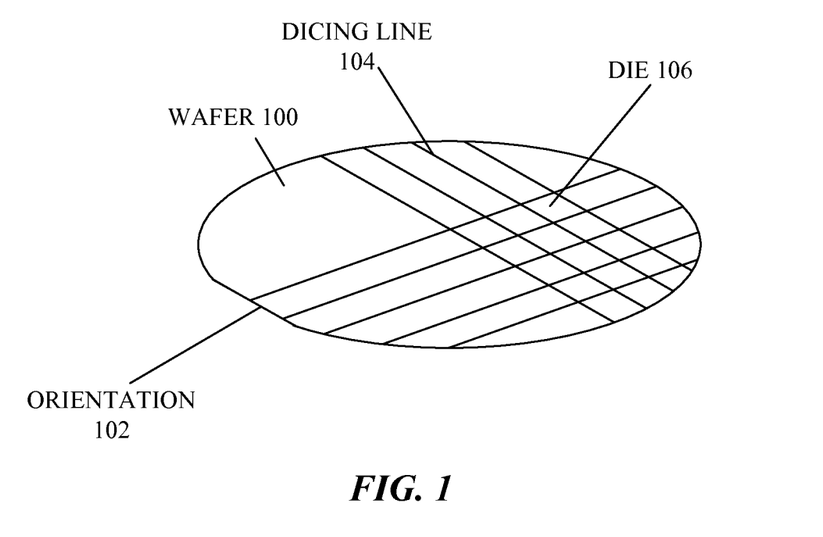
FIG. 1 illustrates a perspective view of a semiconductor wafer in an aspect of the present disclosure.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
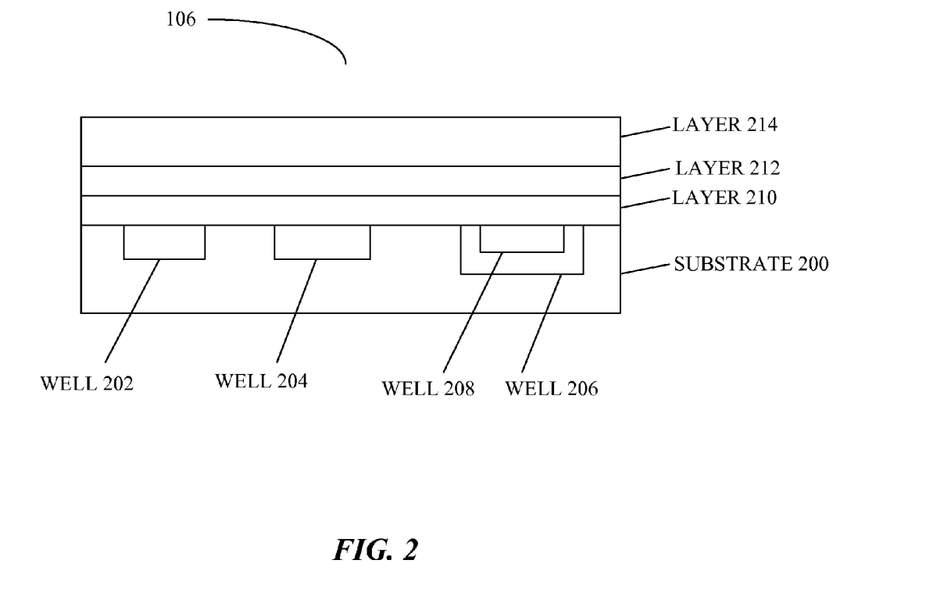
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3A:
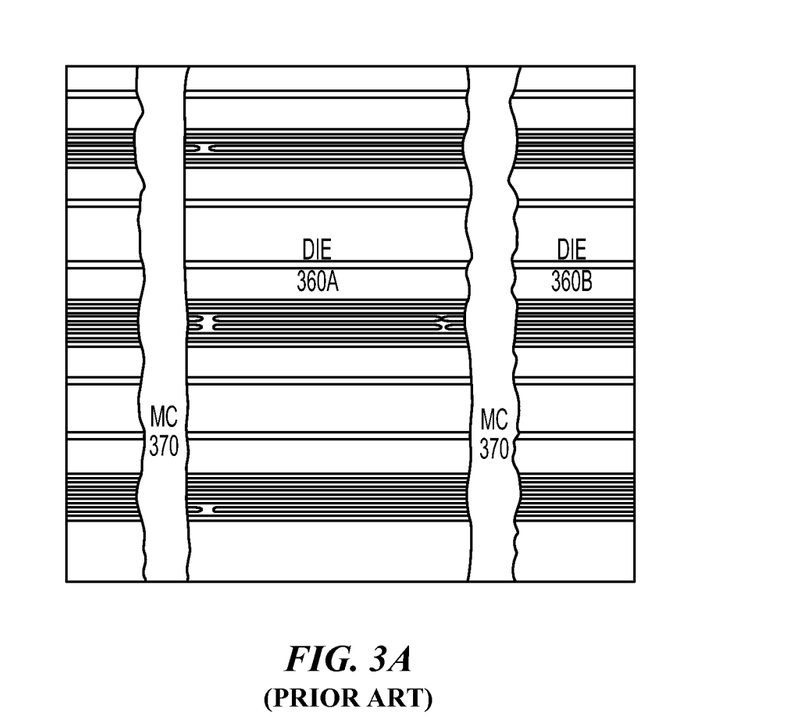
FIGS. 3A and 3B illustrate a top view and a side view of a conventional split die architecture.
Figure 3B:
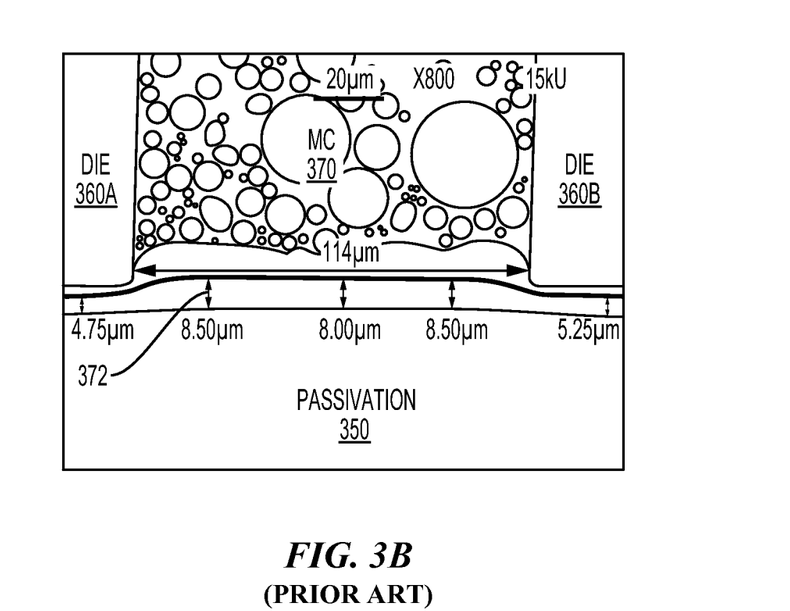

FIGS. 3A and 3B illustrate a top view and a side view of a conventional split die architecture. A first die 360A and a second die 360B are separated by a molding compound (MC) 370 and supported by a passivation layer 350 (e.g., an organic passivation layer). Unfortunately, base material (e.g., polymer) in the molding compound 370 shrinks during wafer level molding. This shrinkage results in the step height difference 372 between the molding compound 370 and the first die 360A and the second die 360B. The step height difference 372 may cause the passivation layer 350 to absorb within the opening between the first die 360A and the second die 360B, resulting in irregularities of a subsequent redistribution layer formed within the passivation layer 350.

Figure 3C:
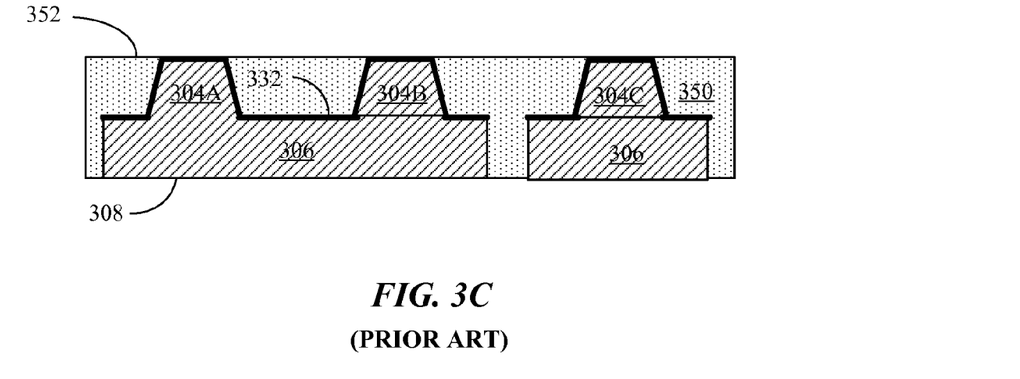
FIG. 3C is a block diagram illustrating a conventional redistribution layer.

FIG. 3C is a block diagram illustrating a conventional redistribution layer 340. In the conventional redistribution layer 340, vias 304 (304A, 304B, 304C) and RDL conductive interconnects 306 are concurrently formed within the passivation layer 350 using, for example, a dual damascene process. In addition, a single barrier layer process is used to form a barrier layer 330 only on a surface of the vias 304 and the RDL conductive interconnects 306 that will face the active dies. Unfortunately, irregularities in the surface 352 of the passivation layer 350 due to the step height difference 372 of FIG. 3B may prohibit formation of a sufficiently flat surface 308 of the RDL conductive interconnects 306.

Figure 3D:
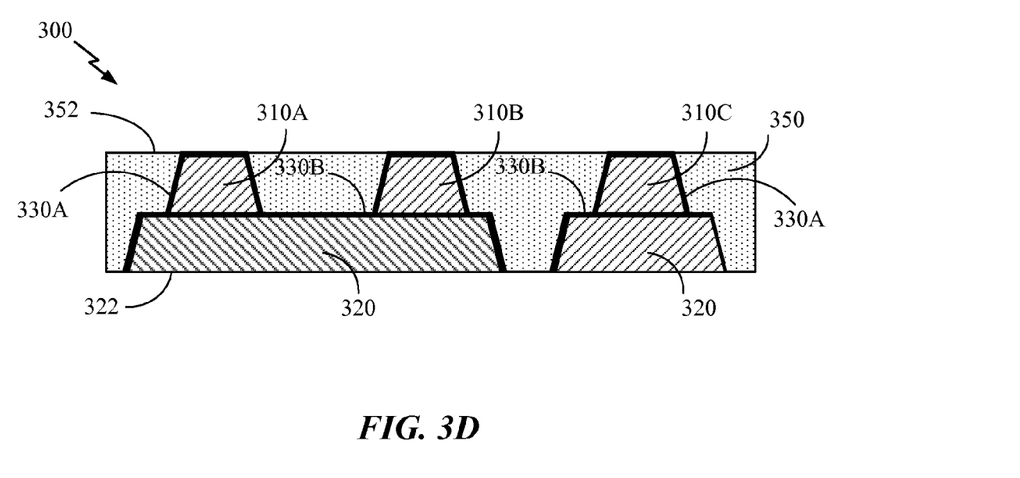
FIG. 3D is a block diagram illustrating a redistribution layer in accordance with an aspect of the present disclosure.

FIG. 3D illustrates a redistribution layer 300 in accordance with an aspect of the present disclosure. Referring to FIG. 3D, the redistribution layer 300 includes vias 310 (310A, 310B and 310C) and RDL conductive interconnects 320 formed within a passivation layer 350. Of course, the number and arrangement of the vias and RDL conductive interconnects is merely exemplary, for ease of illustration, and not limiting. The passivation layer 350 may, for example, comprise an organic material, such as a polymer dielectric material.

The vias 310 and the RDL conductive interconnects 320 may be separately formed by way of separate single damascene processes. As further described below, a first damascene process enables planarization of the vias 310 and the passivation layer 350 prior to formation of the RDL conductive interconnects 320 to overcome the step height difference 372 of FIG. 3B. In some aspects, the vias 310 and the RDL conductive interconnects 320 may be composed of copper or other suitable conductive material. The vias 310 include a first portion 330A of a barrier layer 330 on the sidewalls and a surface of the vias 310 that will couple to active die.

In this aspect of the disclosure, the first damascene process is performed to line the first portion 330A of the barrier layer 330 on the sidewalls and the surface of the vias 310 that will couple to active die. Once openings of the vias 310 are lined, the openings may be filled with a conductive material. According to this first damascene process, the conductive material within the vias 310 and the passivation layer 350 are planarized or polished smooth to complete formation of the vias 310. In some aspects, the conductive material within the vias 310 and the passivation layer 350 may be planarized by techniques such as chemical-mechanical planarization (CMP), for example.

Following completion of the vias 310, a second damascene process is performed to line a second portion 330B of the barrier layer 332 on sidewalls and a surface of a trench openings (not shown) for RDL conductive interconnects 306 that face the active die. Once trench openings of the RDL conductive interconnects 320 are lined, the trench openings may be filled with a conductive material. According to this second damascene process, the conductive material within the RDL conductive interconnects 320 and the passivation layer 350 are planarized or polished smooth to complete formation of the RDL conductive interconnects 320 with a sufficiently flat surface 322. The conductive material within the RDL conductive interconnects 320 and the passivation layer 350 may also be planarized by CMP.

In this arrangement, the second portion 330B of the barrier layer 330 also separates the vias 310 from the RDL conductive interconnects 320, in contrast to the direct coupling of the vias 304 and the RDL conductive interconnects 306 shown in FIG. 3C. The barrier layer 330 may be deposited or otherwise formed by a process such as physical vapor deposition (PVD) or the like. In aspects of the disclosure, the conventional redistribution layer 340 of FIG. 3C is combined with the redistribution layer 300 of FIG. 3C, for example, as shown in FIG. 4.

Figure 4:
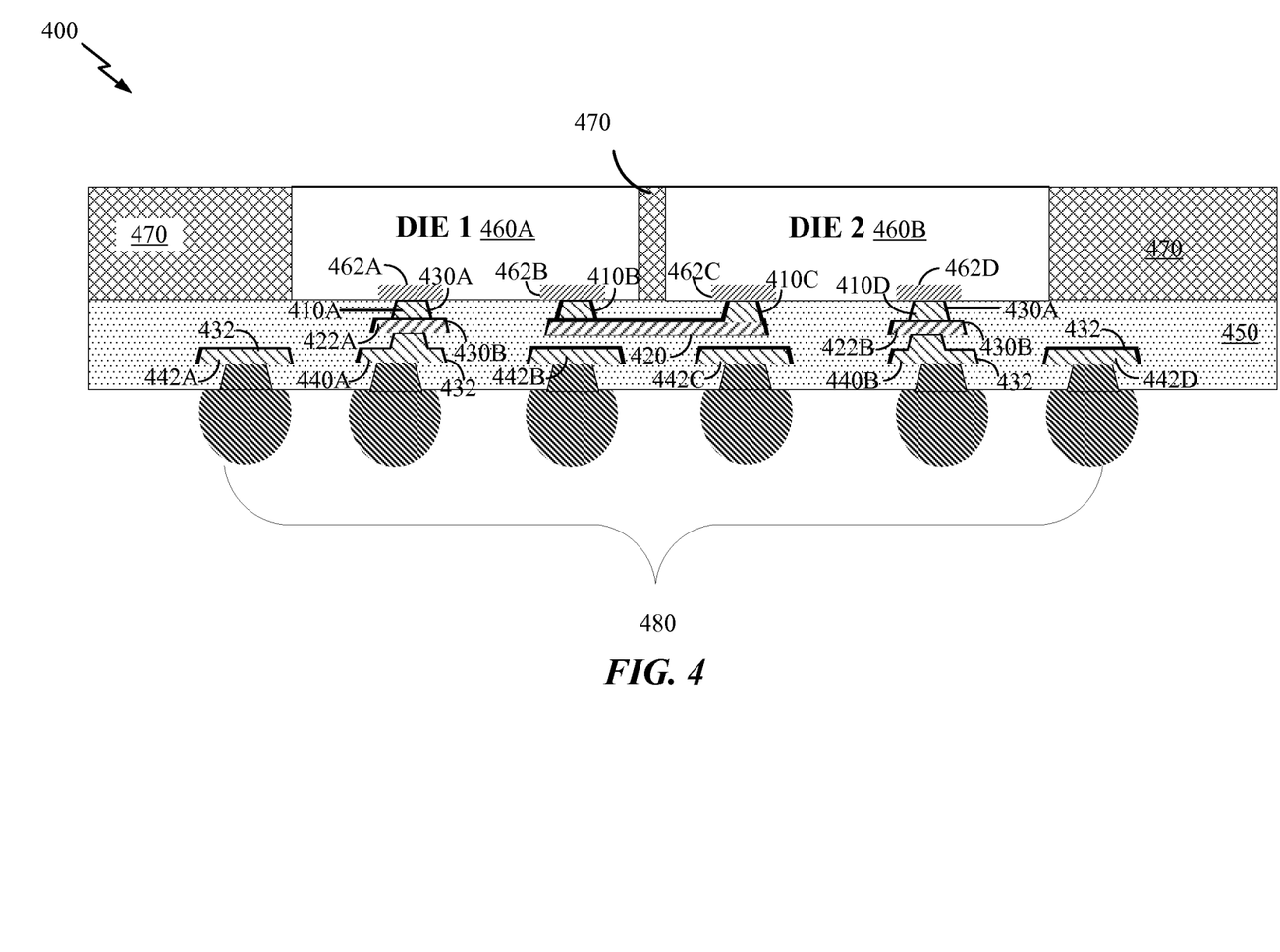
FIG. 4 illustrates a semiconductor device according to one aspect of the present disclosure.

FIG. 4 illustrates a semiconductor device 400 in accordance with aspects of the present disclosure. The semiconductor device 400 includes a first die 460A and a second die 460B that are separated by a molding compound (MC) 470 and supported by a passivation layer 450 (e.g., an organic passivation layer). Although only two die are shown, this is merely for ease of illustration and additional die may be included in the semiconductor device. The die may be arranged and subjected to molding (see molding compound 470).

The passivation layer 450 of the semiconductor device 400 may also include one or more organic passivation layers. A first set of vias 410 (e.g., 410A, 410B, 410C, 410D) may be fabricated in the passivation layer 450 and coupled to contact pads 462 (e.g., 462A, 462B, 462C, 462D) of the first die 460A and the second die 460B. The first set of vias 410 may be fabricated using a damascene process, a laser via and fill process or other like process for via formation. The vias 410 are lined with a first portion 430A of a barrier layer 430 and filled with a conductive material. Once fabricated, the first set of vias 410 and the passivation layer 450 are planarized, for example, according to a first damascene process. Once planarized, a second damascene process is performed to couple the first set of vias 410 to first RDL conductive interconnects (e.g., 420 and/or 422) through a second portion 430B of the barrier layer 430.

In this arrangement, a die-to-die RDL conductive interconnect 420 couples the first die 460A and the second die 460B by joining the vias 410B and 410C through a second portion 430B of the barrier layer 430. In addition, first RDL conductive interconnects 422 (e.g., 422A and 422B) may couple the vias 410A and 410D through the second portion 430B of the barrier layer 430. The die-to-die RDL conductive interconnect 420 and the first RDL conductive interconnects 422 may, in some aspects, comprise conductive traces and/or conductive pads. The conductive pads or traces may be composed of copper or other suitable conductive material.

The semiconductor device 400 may further include a conventional redistribution layer 440 (e.g., 440A and 440B), for example, as shown in FIG. 3C. In this arrangement, vias 304 (FIG. 3) and RDL conductive interconnects 306 (FIG. 3) are concurrently formed within the passivation layer 450 using, for example, a dual damascene process. In addition, a single barrier layer process is used to form a barrier layer 432 only on a surface of the conventional redistribution layer 440 that will face the active dies. The RDL conductive interconnects 306 (FIG. 3) and the vias 304 (FIG. 3) of the conventional redistribution layer 440 may be formed using a semi-additive process such as, for example, a dual damascene process.

In some aspects, the semiconductor device 400 may further include a package conductive interconnect 480. The package conductive interconnect 480 may be coupled to second RDL conductive interconnects 442 (e.g., 442A, 442B, 442C, 442D). In addition, the package conductive interconnect 416 may couple to a system board, a package substrate or other suitable carrier substrate (not shown). The package conductive interconnect 416 may be configured according to a ball grid array (BGA) interconnect structure.

FIGS. 5A-5F illustrate a semiconductor device structure 500 at various stages of fabrication in accordance with aspects of the present disclosure. For example, FIGS. 5A-5F illustrate a sequential fabrication approach for the semiconductor device 400 shown in FIG. 4.

Figure 5A:
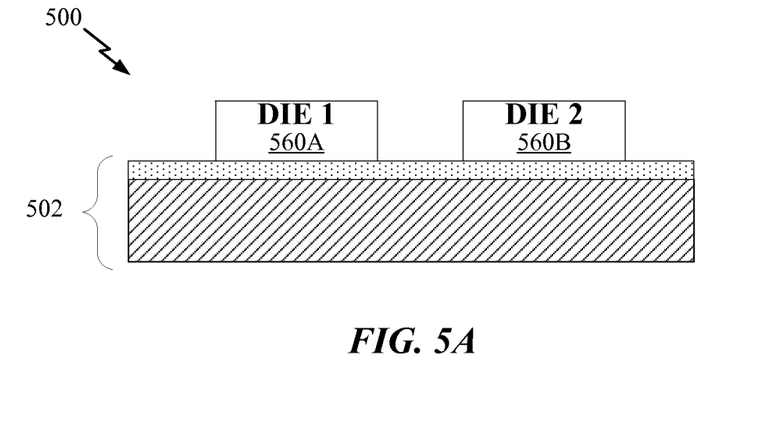
FIGS. 5A-5F illustrate a semiconductor device at various stages of fabrication according to one aspect of the present disclosure.

Beginning with FIG. 5A, a carrier substrate 502 (e.g., a semiconductor wafer) is provided. The carrier substrate 502 may be, for example, a silicon-based substrate, a glass-based substrate or other materials such as those implemented with bulk substrates for semiconductor wafers. A pair of split die, including a first semiconductor die 560A and a second semiconductor die 560B, may be placed face down on and fixed to the carrier substrate 502 using, for example, an adhesive layer (e.g., tape). The first semiconductor die 560A and the second semiconductor die 560B may, for example, be arranged on the substrate using a pick and place (PnP) or cap place process.

Figure 5B:
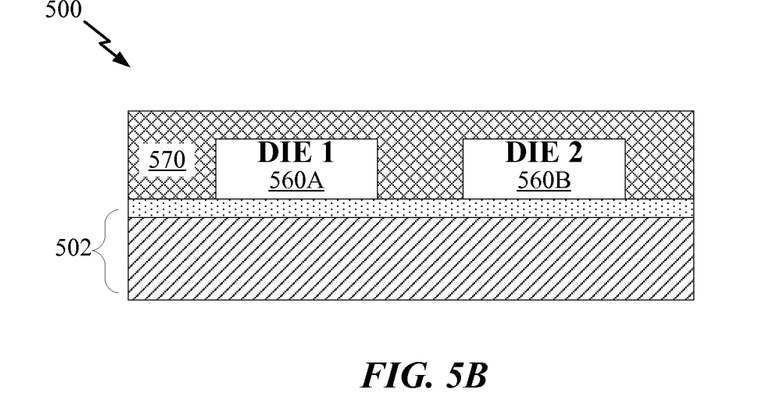
Figure 5C:
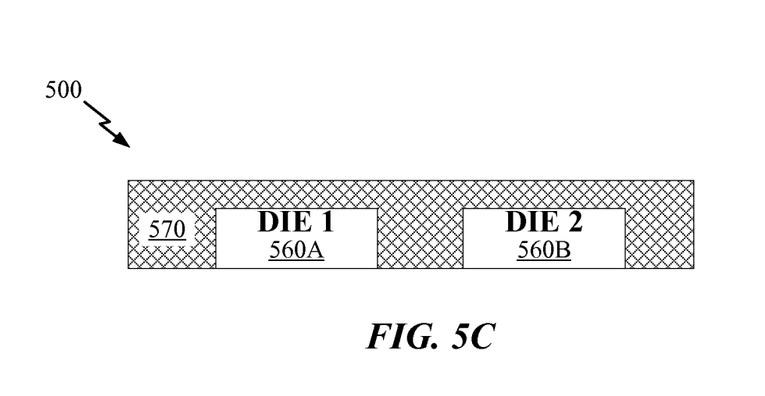

In FIG. 5B, a molding compound 570 is applied to encapsulate the first semiconductor die 560A and the second semiconductor die 560B. Thereafter, the carrier substrate 502 is debonded and removed, leaving the first semiconductor die 560A and the second semiconductor die 560B encapsulated within the molding compound 570, as shown in FIG. 5C.

Figure 5D:
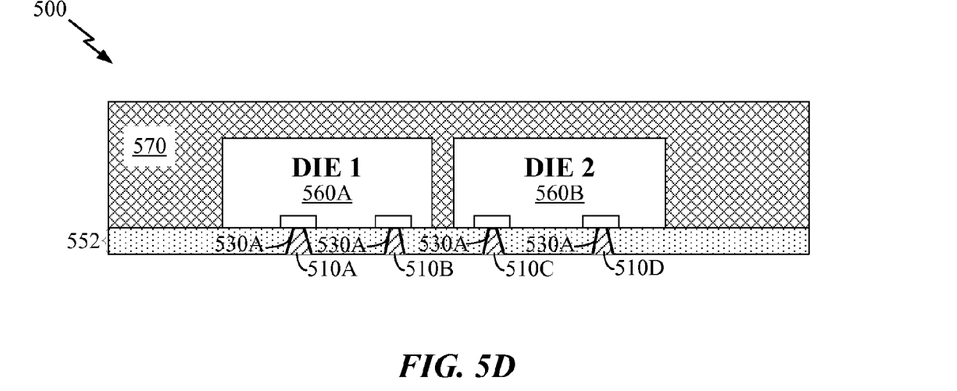

In FIG. 5D, damascene processing is used to fabricate a redistribution layer of the semiconductor device. A first passivation layer 552 is coated on the surface of the first semiconductor die 560A and the second semiconductor die 560B. The first passivation layer 552 may be an organic passivation layer and may comprise a polymer dielectric. A first set of vias 510 (e.g., 510A, 510B, 510C, 510D) may be formed in the first passivation layer 552. In some aspects, the first set of vias 510 may be formed by way of a lithographic fabrication process.

In another aspect of the present disclosure, a first damascene process is performed to line a first portion 530A of the barrier layer 530 (e.g., a first barrier layer) on the sidewalls and a surface of the vias 510 that will couple to the first semiconductor die 560A or the second semiconductor die 560B. A conductive material (e.g., Cu) may be deposited using a physical vapor deposition process and an electroplating process to fill the first set of vias 510. Thereafter, a planarization process, such as CMP, is applied to the first passivation layer 552 and the first set of vias 510. In this aspect of the disclosure, the damascene process enables planarization of the first set of vias 510 and the first passivation layer 552 prior to formation of RDL conductive interconnects to overcome the step height difference 372 of FIG. 3B.

Figure 5E:
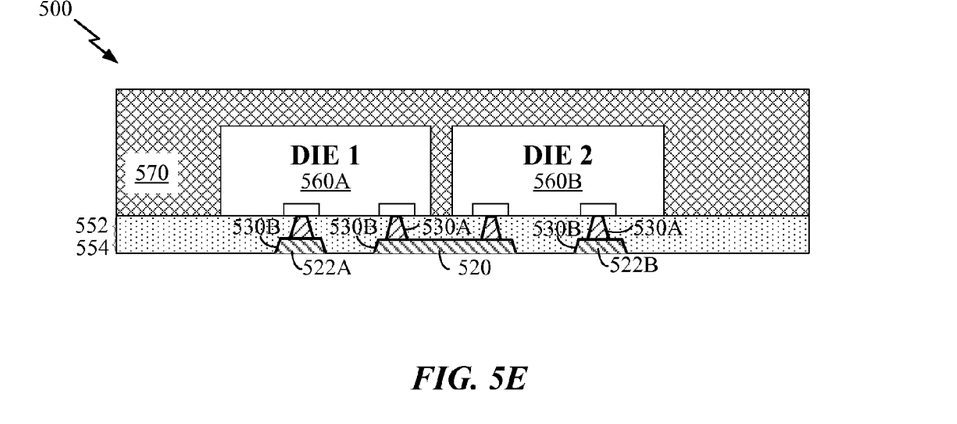

In FIG. 5E, a damascene process may be used to form conductive pads and traces of the semiconductor device. In this arrangement, a second passivation layer 554 may be coated on the planarized surface of the first passivation layer 552 and the first set of vias 510. Trace trenches and pad openings may be formed in the second passivation layer 554 to provide additional RDL conductive interconnects using a lithographic process. A second portion 530B of the barrier layer 530 (e.g., a second barrier layer) may be deposited to line the first RDL conductive interconnects 522 (522A, 522B) and a die-to-die RDL conductive interconnect 520. The pad openings and trace trenches may then be filled with a conductive material such as copper or another suitable conductive material. The deposition may be conducted using an electroplating process (e.g., ECP). Thereafter, a planarization process, such as CMP, is applied to the second passivation layer 554 and conductive material fills the first RDL conductive interconnects 522 and the die-to-die RDL conductive interconnect 520.

By forming the RDL using damascene processing, variation in height between the molding compound 570 and the first semiconductor die 560A and the second semiconductor die 560B may beneficially be reduced. In particular, planarization of the first passivation layer 552 and the first set of vias 510 avoids irregularities caused by the step height difference 372 of FIG. 3B. In addition, the subsequent planarization of the first RDL conductive interconnects 522 and a die-to-die RDL conductive interconnect 520 enables precise formation of the conductive interconnect layers to fabricate a line/space below, for example, two (2) microns by two (2) microns.

Figure 5F:
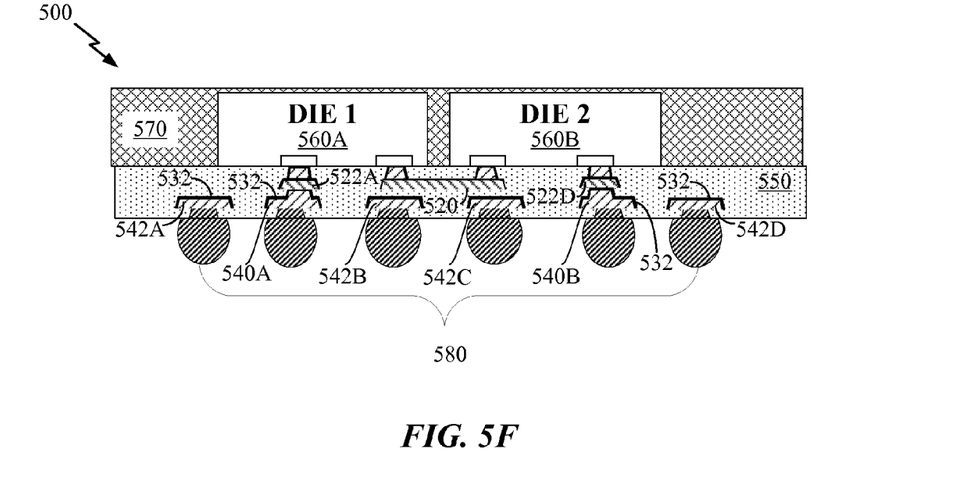

As shown in FIG. 5F, additional vias, additional conductive pads and additional conductive traces may be included in the semiconductor device structure 500 according to the conventional RDL layer, for example, as shown in FIG. 3C. As shown in FIG. 4, the semiconductor device 400 may further include a conventional redistribution layer 440 (e.g., 440A and 440B), for example, as shown in FIG. 3C, to provide a second set of vias and second RDL conductive interconnects. In this arrangement, vias 304 (FIG. 3) and RDL conductive interconnects 306 (FIG. 3) are concurrently formed within the passivation layer 550 using, for example, a dual damascene process, as shown in FIG. 5F. In addition, a single barrier layer process is used to form a barrier layer 532 only on a surface of the conventional redistribution layer 540 that will face the active dies. The additional conductive traces and the additional vias of the conventional redistribution layer 540 may be formed using a semi-additive process such as, for example, a dual damascene process.

A passivation layer 550 may be coated on a surface of the second passivation layer 554 and conductive material within the pad openings and the trace trenches. Additional vias may be formed in the passivation layer 550. The vias may be formed using a damascene process, a semi-additive process, a laser via and fill process or other like process for via formation. In one example, the vias are formed using a lithographic process. A barrier and seed layer may be deposited in the opening of the additional via openings. A photoresist (PR) may be deposited and lithographically processed. An electroplating process may be applied. The passivation layer 550 and the barrier layer of the vias may be planarized using etch processing or other planarization processes (e.g., grinding or polishing). For example, the photoresist (PR) may be removed by a PR strip process and the barrier/seed layer may be removed by a wet chemical etching process.

In some aspects, an additional passivation layer may be coated on the etched vias. Additional conductive pads and trace trenches may be lithographically formed. The additional conductive pads may, in some aspects comprise a package conductive interconnect layer for attaching a ball grid array (BGA).

In some aspects, the semiconductor device 500 may further include a package conductive interconnect 580. The package conductive interconnect 580 may be coupled to second RDL conductive interconnects 542 (e.g., 542A, 542B, 542C, 542D). In addition, the package conductive interconnect 516 may couple to a system board, a package substrate or other suitable carrier substrate (not shown). The package conductive interconnect 516 may be configured according to a ball grid array (BGA) interconnect structure.

It should be recognized that a semiconductor device according to aspects of the present disclosure is not limited to the number of layers shown in FIGS. 4 and 5A-5F.

Figure 6:
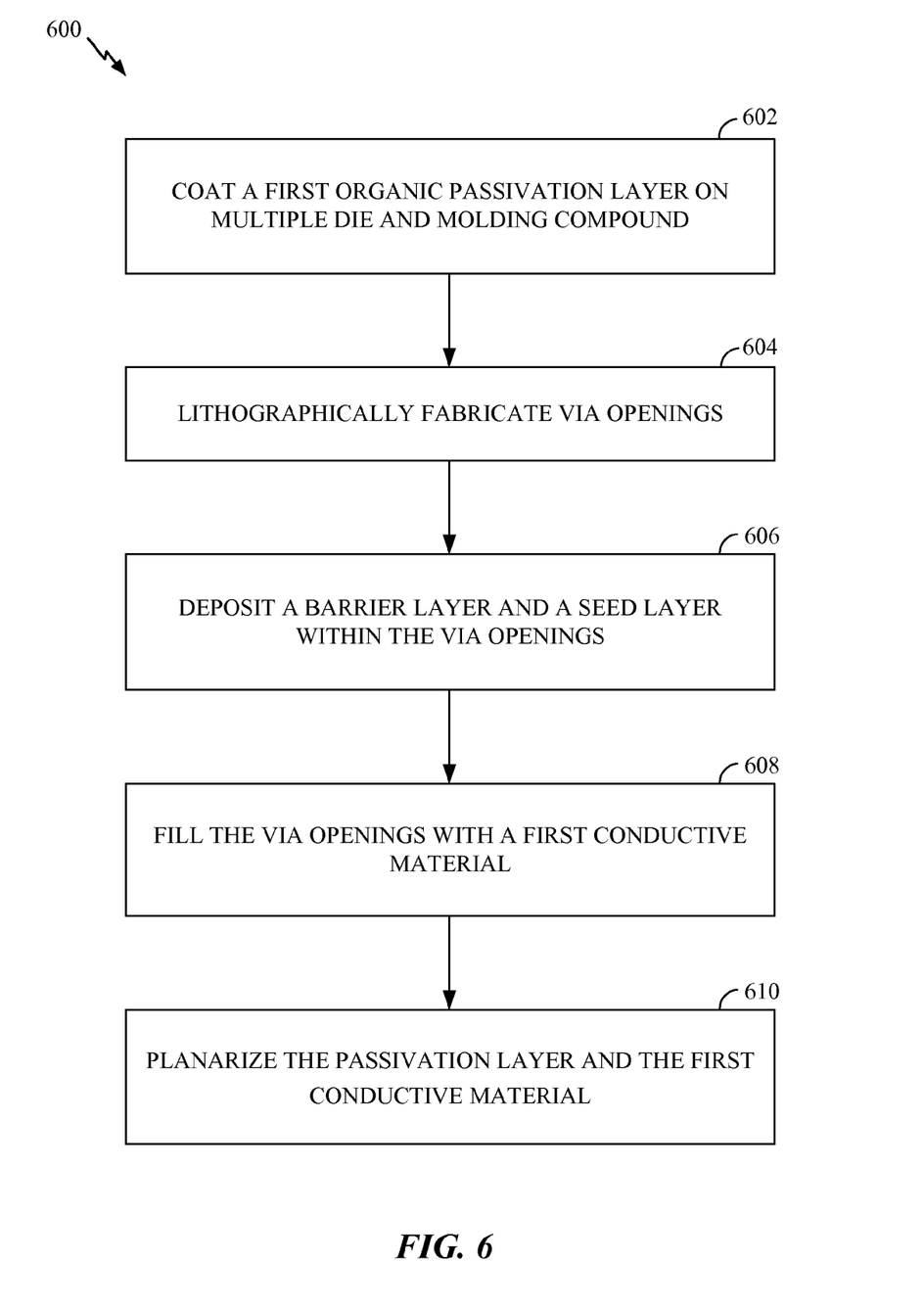
FIG. 6 is a process flow diagram illustrating a method for fabricating a high density fan out package structure according to an aspect of the present disclosure.

FIG. 6 is a flow diagram illustrating a method 600 for manufacturing a semiconductor device according to one aspect of the disclosure. At block 602, a first organic passivation layer is coated on a plurality of die and molding compound. At block 604, via openings are lithographically fabricated. At block 606, a barrier layer and a seed layer are deposited within the via openings. At block 608, the via openings are filled with a first conductive material. At block 610, the passivation layer and the first conductive material are planarized. The passivation layer and first conductive material may be planarized via a CMP process.

In some aspects, a second organic passivation layer may be coated on the planarized passivation layer. Additional conductive pads and trace trenches may be lithographically fabricated in the second organic passivation layer. A barrier and seed layer may be deposited within the pad and trace trenches. The pad and trace trenches may, in turn, be filled with a second conductive material. The second conductive material may be composed of copper or other suitable conductive material. The second passivation layer and the second conductive material may be planarized. The second passivation layer and the second conductive material may, for example be planarized using a CMP process.

In some aspects, additional vias, pads and traces may be formed on a surface of the planarized second passivation layer and second conductive material. The additional vias, pads and traces may be formed using semi-additive processing. In some aspects, an interconnect layer may be coupled to the additional pads. The interconnect layer may be used to attach a ball grid array.

According to an aspect of the present disclosure, a semiconductor device including multiple die is described. In one configuration, the semi-conductor device includes a passivation layer (RDL) supporting the die. The passivation layer includes multiple vias having a barrier layer. The RDL further includes means for interconnecting the vias through the barrier layer, with the vias coupling the semiconductor die to the interconnecting means. The interconnecting means may be the RDL conductive interconnects 320/420/520 or the die-to-die RDL conductive interconnect 520. In another aspect, the aforementioned means may be any module or any apparatus or material configured to perform the functions recited by the aforementioned means.

Figure 7:
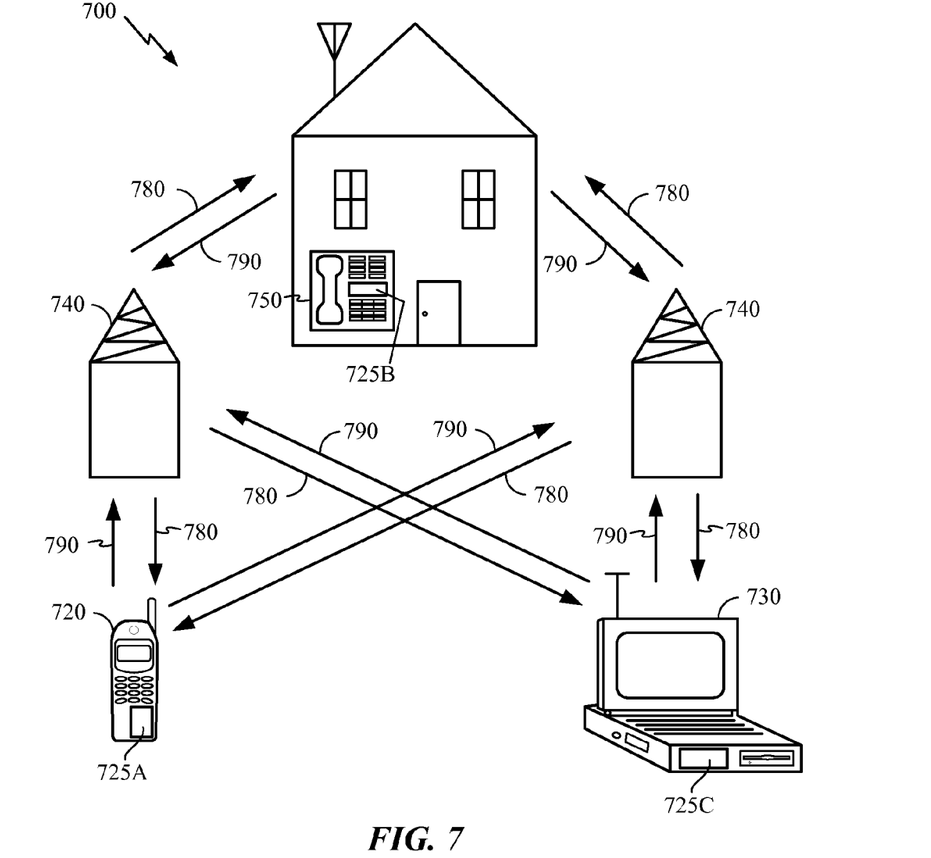
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed semiconductor device. It will be recognized that other devices may also include the semiconductor device, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units 720, 730, and 750 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed IC devices.

Figure 8:
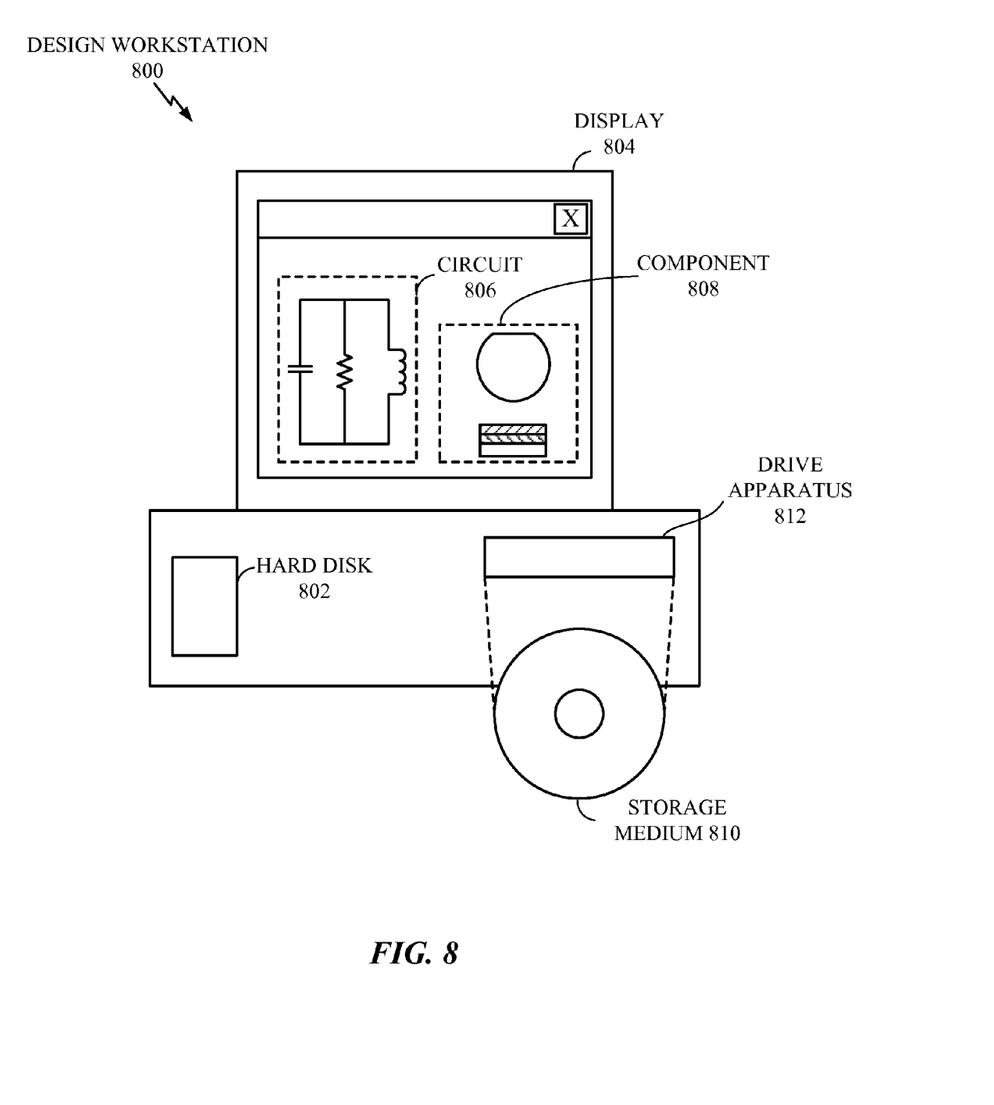
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the IC devices disclosed above. A design workstation 800 includes a hard disk 802 containing operating system software, support files, and design software such as Cadence or OrCAD. The design workstation 800 also includes a display 804 to facilitate design of a circuit 806 or a semiconductor component 808 such as a semiconductor device. A storage medium 810 is provided for tangibly storing the design of the circuit 806 or the semiconductor component 808. The design of the circuit 806 or the semiconductor component 808 may be stored on the storage medium 810 in a file format such as GDSII or GERBER. The storage medium 810 may be a CD-ROM, DVD, hard disk, flash memory, or other appropriate device. Furthermore, the design workstation 800 includes a drive apparatus 812 for accepting input from or writing output to the storage medium 810.

Data recorded on the storage medium 810 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 810 facilitates the design of the circuit 806 or the semiconductor component 808 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification and in Appendix A. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein and in Appendix A may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein and in Appendix A. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "a step for."

What is claimed is:

1. A semiconductor device, comprising:
   a first semiconductor die; and
   a passivation layer supporting the first semiconductor die, the passivation layer comprising a first via having a first barrier layer and a first redistribution layer (RDL) conductive interconnect having a second barrier layer, wherein the first RDL conductive interconnect is coupled to the first via and the first barrier layer through the second barrier layer, the first via coupling the first semiconductor die to the first RDL conductive interconnect.

2. The semiconductor device of claim 1, further comprising:
   a second semiconductor die; and
   a second via having the first barrier layer and coupled to the first RDL conductive interconnect having the second barrier layer through the second barrier layer, the second via coupling the second semiconductor die to the first RDL conductive interconnect.

3. The semiconductor device of claim 1, further comprising:
   a second via coupled to the first RDL conductive interconnect through a third barrier layer; and
   a second RDL conductive interconnect directly coupled to the second via.

4. The semiconductor device of claim 3, further comprising a package interconnect layer directly coupled to the second RDL conductive interconnect.

5. The semiconductor device of claim 1, further comprising at least one of a music player, a video player, an entertainment unit, a navigation device, a communications device, a personal digital assistant (PDA), a fixed location data unit, and a computer.

6. A semiconductor device, comprising:
   a first semiconductor die; and
   a passivation layer supporting the first semiconductor die, the passivation layer comprising a first via having a first barrier layer, a second via having the first barrier layer and a means for interconnecting the first via, the first barrier layer, and the second via through a second barrier layer, the first via coupling the first semiconductor die to the interconnecting means.

7. The semiconductor device of claim 6, further comprising a second semiconductor die coupled to the first interconnecting means by the second via.

8. The semiconductor device of claim 6, further comprising:
   a package conductive interconnect; and
   means for directly interconnecting the package conductive interconnect and the second via.

9. The semiconductor device of claim 6, further comprising additional vias and means for directly interconnecting the additional vias to each other but not through the second barrier layer.

10. The semiconductor device of claim 6, the semiconductor device integrated into a circuit, the circuit incorporated into at least one of a music player, a video player, an entertainment unit, a navigation device, a communications device, a personal digital assistant (PDA), a fixed location data unit, and a computer.

* * * * *